United States Patent [19]

Marks et al.

[11] Patent Number: 4,600,912
[45] Date of Patent: Jul. 15, 1986

[54] DIAPHRAGM PRESSURE SENSOR WITH IMPROVED TENSILE LOADING CHARACTERISTICS

[75] Inventors: Eugene A. Marks, Riverside; Arthur J. Peters, Norco, both of Calif.

[73] Assignee: Bourns Instruments, Inc., Riverside, Calif.

[21] Appl. No.: 695,126

[22] Filed: Jan. 25, 1985

[51] Int. Cl.$^4$ ............................................. H01L 10/10
[52] U.S. Cl. ........................................ 338/42; 338/4; 310/338; 73/720
[58] Field of Search ........................... 338/2, 4, 36, 42; 73/715, 720, 723, 725, 726; 310/338

[56] References Cited

U.S. PATENT DOCUMENTS

| | | | |
|---|---|---|---|
| 3,168,718 | 2/1965 | Swartz et al. | 338/42 |
| 3,377,866 | 4/1968 | Flavin | 338/4 |
| 3,461,416 | 8/1969 | Kaufman | 338/4 |
| 3,899,766 | 8/1975 | Mermelstein | 338/42 |
| 3,916,365 | 10/1975 | Giachino | 338/2 |
| 4,127,840 | 11/1978 | House | 338/4 |
| 4,216,404 | 8/1980 | Kurtz et al. | 310/338 |
| 4,303,903 | 12/1981 | Matsuoka et al. | 338/4 |
| 4,412,203 | 10/1983 | Kurtz et al. | 338/4 |

Primary Examiner—Clarence L. Albritton
Assistant Examiner—M. M. Lateef
Attorney, Agent, or Firm—Howard J. Klein; William G. Becker

[57] ABSTRACT

A diaphragm-type pressure sensor employs a monocrystalline wafer as a pressure-responsive diaphragm. The wafer has a central active area surrounded by a first bonding area on one side and a second bonding area on the other side. The first bonding area is attached by a first layer of bonding material to a base, and the second bonding area is attached by a second layer of bonding material to a cap. The inside diameter of the first bonding layer is greater than the inside diameter of the second bonding layer by an amount of at least approximately six times the thickness of the diaphragm. This disparity between the respective inside diameters of the two bonding layers results in the relief of radially-directed tensile loading on the first bonding layer when a pressure to be measured is applied to the first side of the diaphragm. Consequently, the probability of a fracture occurring in this bonding layer is minimized.

18 Claims, 2 Drawing Figures

DIAPHRAGM PRESSURE SENSOR WITH IMPROVED TENSILE LOADING CHARACTERISTICS

BACKGROUND OF THE INVENTION

This invention relates generally to the field of pressure transducers. More particularly, it relates to a sensor for such transducers which employs a pressure-responsive diaphragm carrying solid-state, piezoresistive elements.

One type of pressure transducer which has generated much interest in recent years is the type which employs a pressure-responsive diaphragm of dielectric material on which are epitaxially grown semiconductor piezoresistive strain gauges. The strain gauges are formed in an appropriate circuit, such as a bridge circuit, so that a deflection of the diaphragm in response to a pressure produces a pressure-indicative voltage signal. Typical materials for the diaphragm are monocrystalline aluminum oxide (i.e., sapphire), beryllium oxide, and spinel. Silicon is the predominant choice for the strain gauge material. Examples of this type of transducer can be found in U.S. Pat. No. 3,916,365 to Giachino and U.S. Pat. No. 4,127,840 to House.

In a typical application, a diaphragm of the type described above, is sandwiched between upper and lower housing elements. More specifically, the diaphragm is bonded, at the periphery of its lower side, to a lower housing element, and at the periphery of its upper side to an upper housing element, with the strain gauges being located in a central "active area", usually on one side or the other of the diaphragm. It is desirable, especially where the transducer is to be exposed to widely-varying temperatures, to form the housing elements of a material having a thermal coefficient of expansion which is closely matched to that of the diaphragm. Without such a match, the diaphragm would undergo stresses as the temperature varied, thereby yielding erroneous readings due to, for example, null point shifting. Thus, in a transducer having a sapphire diaphragm it is highly advantageous to form the housing elements of amorphous aluminum oxide.

For the same reason, it is desirable to provide a bonding agent between the diaphragm and the housing elements which has a coefficient of thermal expansion approximately equal to those of the diaphragm and of the housing elements. Typically, the bonding agent is a glass provided as a frit in a raw form. It is within the expertise of those of typical skill in the pertinent arts to formulate a glass of suitable composition having a coefficient of thermal expansion approximately equal to that of, e.g., aluminum oxide, upon fusing at high temperature.

One problem experienced with the construction described above is that the fused glass bonding material, although having high compression strength, has relatively low tensile strength. The low tensile strength of this glass material can result in the fracturing of one or both of the bonding layers (between the diaphragm and the upper housing element, and between the diaphragm and the lower housing element) as the diaphragm is loaded by pressures approaching or exceeding its overpressure limit. This result is due to the fact that, at the inside edges of these bonding layers, the tensile loading exceeds the compressive loading for any significant axial deflection of the diaphragm's central active area.

The prior art has approached this problem by seeking structurally to isolate the bonding layers from tensile stresses, thereby subjecting these layers, ideally, only to compressive loading. This approach has resulted in complex designs that are relatively costly and difficult to manufacture.

From the foregoing, it can be seen that a pressure sensor design which minimizes the problem of bonding layer fracture from tensile loading, without the need for a complex mechanical structure, would fill a long-felt, yet unsatisfied need in the pertinent industry.

SUMMARY OF THE INVENTION

Broadly, the present invention is a pressure sensor, of the type having a pressure-responsive diaphragm bonded on one side to a first housing element, and on the other side to a second housing element, wherein the bond on the first side is by a bonding layer having an inside diameter which is greater than the inside diameter of the bonding layer on the second side.

More specifically, the sensor of the present invention employs a diaphragm having a central pressure-responsive or active area surrounded by a first bonding area on the first side and a second bonding area on the second side. Between the first bonding area and the first housing element is a first layer of bonding material, and between the second bonding area and the second housing element is a second layer of bonding material. The first bonding area has an inside diameter that is greater than the inside diameter of the second bonding area by an amount at least six (6) times the thickness of the diaphragm over its active area. In addition, the two bonding areas have a significant overlapping area advantageously with a width that is at least three (3) times greater than the difference between the respective inside diameters of the first and second bonding areas.

Each of the housing elements has a central recess so that first and second chambers are defined on opposite sides of the diaphragm. The first chamber is adapted to receive, via a passage in the first housing element, a pressure to be measured. The second chamber is provided with a reference pressure, either by communication to a reference pressure source via a passageway in the second housing element, or by virtue of having been evacuated and sealed (to measure absolute pressure). In either case, strain-sensing elements (e.g., piezoresistors) are provided on the active area of the reference pressure side of the diaphragm to sense the pressure-induced strain on the diaphragm, and to produce an output signal indicative of the pressure differential across the diaphragm.

By making the inside diameter of the first bonding area measurably greater than the inside diameter of the second bonding area (e.g., by an amount of at least 6 times the diaphragm thickness), it has been found that the radial component of the tensile loading on the bonding layer is substantially reduced, if not eliminated. This radial component is that portion of the tensile loading contributed by stresses resulting from the pressure-induced bending of the diaphragm toward the reference pressure chamber (the assumption being that the measured pressure is greater than the reference pressure).

The remaining tensile loading component is axially-directed, and is a function of stresses resulting from the axially-directed application of pressure transferred from the diaphragm to the bonding layer. The overlapping area of the two bonding layers must be sufficient to withstand this axial loading to prevent separation of the sensor components. In larger-sized sensors, sufficient overlapping area is rarely a problem. In smaller sizes, however, it has been found that the width of the overlapping area should be at least approximately three times the difference between the respective inside diameters of the first and second bonding areas to assure sufficient support against axial loading to prevent component separation, especially when the diaphragm is subjected to pressures approaching or exceeding the overpressure limit.

By minimizing or reducing the radially-directed tensile loading on the bonding layer, the above-described construction minimizes the probability of bonding layer fracture, thereby allowing the use of glass bonding materials thermally matched to the other sensor components. Moreover, this result is accomplished without a complex mechanical structure for isolating the bonding layers from tensile stresses.

DETAILED DESCRIPTION OF THE INVENTION

Figure 1:
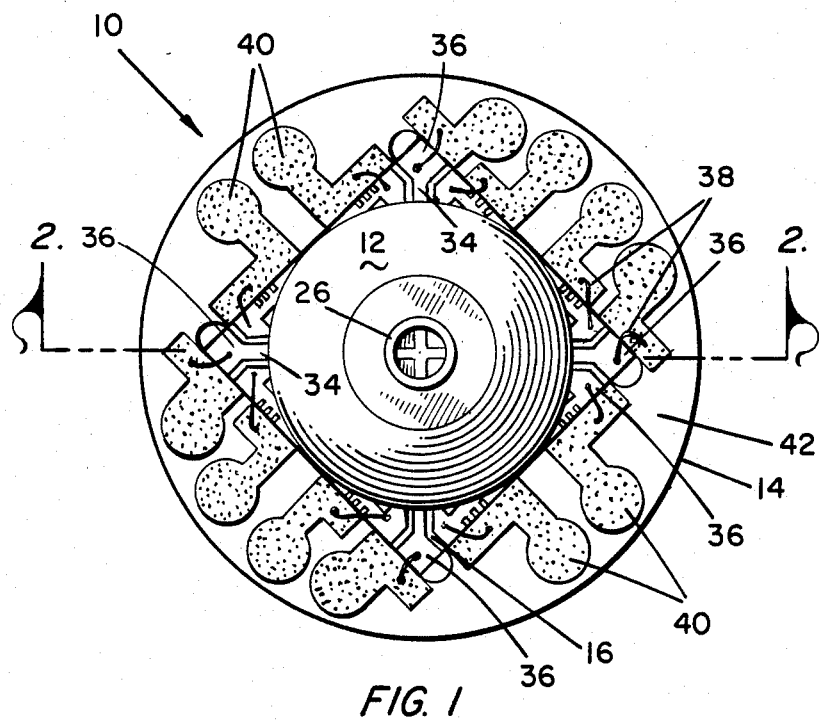
FIG. 1 is a top plan view of a pressure sensor constructed in accordance with a preferred embodiment of the invention.

Referring to the drawings, a pressure sensor 10 in accordance with a preferred embodiment of the invention is shown. The sensor 10 has a housing comprising a cap 12 and a base 14, both preferably made of an aluminum oxide ceramic. Retained between the cap 12 and the base 14 is a diaphragm 16, which is the pressure-responsive element of the sensor. The diaphragm 16 is a substantially square wafer of monocrystalline material, preferably sapphire or spinel, although silicon may also be used. In the preferred embodiment described herein, the diaphragm 16 is a wafer of monocrystalline sapphire, having a substantially uniform thickness.

The diaphragm 16 has a central area, the active area, which is subject to a reference pressure and a pressure to be measured, as will be described below. The active area of the diaphragm 16 is provided with strain gauges which, preferably, consist of epitaxially-deposited silicon piezoresistors 17 (FIG. 2) configured in an appropriate circuit, such as a Wheatstone bridge circuit, as is well-known in the art. See, for example, U.S. Pat. No. 3,916,365 and U.S. Pat. No. 4,127,840.

The inside of the cap 12 is configured with a central recess 18 encompassed by a peripheral annular shoulder 20. The base 14 also has a central recess 22, peripherally encompassed by a flat diaphragm seating surface 24. When the cap 12, diaphragm 16, and base 14 are assembled, as will be described below, the diaphragm 16 is captured between the shoulder 20 and the seating surface 24, with the inner cap recess 18 forming a reference pressure chamber on one side of the active area of the diaphragm 16, and the inner base recess 22 forming a measured pressure chamber on the other side of the active area of the diaphragm. A reference pressure (e.g., atmospheric pressure) is admitted to the reference pressure chamber via a first conduit 26 communicating with a reference pressure part 28 in the cap 12. The pressure to be measured is communicated to the measured pressure chamber by means of a second conduit 30 leading into a sensing port 32 in the base 14.

The piezoresistors 17 (FIG. 2) are connected, by conductive traces 34 (partially shown in FIG. 1), to bonding pads 36 located near the outer edge of the diaphragm wafer 16. The bonding pads 36, in turn, are connected by wires 38 to terminal pads 40 provided on a peripheral rim 42 of the base 14. Additional wires (not shown) would be used to connect the terminal pads 40 to appropriate circuitry (not shown) for processing the pressure-indicative signals generated by the piezoresistors 17.

Figure 2:
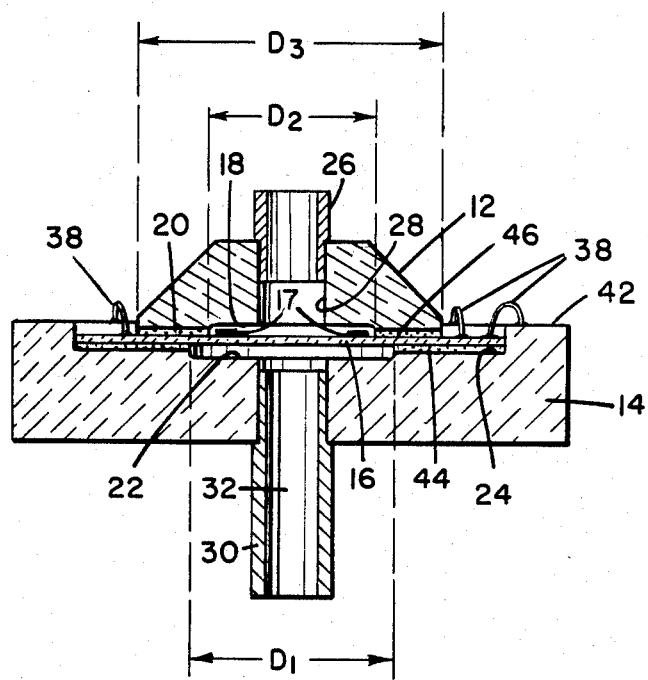
FIG. 2 is a cross-sectional view along line 2—2 of FIG. 1.

As seen in FIG. 2, a first layer 44 of bonding material is applied between one side of the diaphragm 16 and the seating surface 24 of the base 14, and a second layer 46 of bonding material is applied between the other side of the diaphragm 16 and the shoulder 20 of the cap 12. The bonding material is typically a glass, selected for a good match of its coefficient of thermal expansion to that of the diaphragm, cap, and base. For example, in a sensor having a sapphire diaphragm and an aluminum oxide cap and base, a good bonding agent is a borosilicate glass applied as a frit and having, upon firing, a coefficient of thermal expansion in the range of approximately $50 \times 10^{-7}$ in/in $-°C$. to approximately $90 \times 10^{-7}$ in/in $-°C$. A suitable frit for this purpose is marketed by the Vitta Corporation of Wilton, Conn., under the designation "G-1011 Glass Frit". Other suitable bonding agents would be apparent to those skilled in the pertinent arts.

An important feature of the present invention is the configuration of the bonding areas of the diaphragm 16, as shown in FIG. 2. Specifically, the side of the diaphragm 16 exposed to the measured pressure chamber formed by the base recess 22 (hereinafter referred to as the "measured pressure" side of the diaphragm) has a peripheral bonding area which is bonded to the seating surface 24 by the first bonding layer 44. The side of the diaphragm 16 exposed to the reference pressure chamber formed by the cap recess 18 (hereinafter referred to as the "reference pressure" side of the diaphragm) has a peripheral bonding area which is bonded to the cap shoulder 20 by the second bonding layer 46. The base recess 22 has a diameter $D_1$ which also defines the inside diameter of the measured pressure side bonding area of the diaphram, while cap recess 18 has a diameter $D_2$ which defines the inside diameter of the reference pressure side bonding area. It can be seen that the diameter $D_1$ is larger than the diameter $D_2$. It has been discovered by the inventors that by locating the inside edge of the measured pressure side bonding area radially outwardly from the inside edge of the reference pressure side bonding area, the maximum radially-directed tensile loading or force resulting from pressure-induced diaphragm bending or flexing is applied to the diaphragm itself. This is in contrast with prior art transducers of this general type, in which the inside edges of the measured pressure side bonding area and the reference pressure side bonding area are radially-aligned ($D_1$ is approximately equal to $D_2$), wherein the maximum radially-directed tensile force is applied to the bonding layer.

Thus, in the present invention, the diaphragm acts as a "strain relief" for the bonding area, substantially reducing (if not altogether eliminating) the application of radially-directed tensile forces to the bonding layer 44 on the measured pressure side of the diaphragm. Since the measured pressure side usually experiences the higher pressures, the bending of the diaphragm is normally toward the reference pressure chamber. Such a bending causes radially-directed tensile forces to be applied primarily to the measured pressure side bonding layer 44, thereby resulting in frequent failures of this layer in prior art transducers, especially in overpressure situations, because of the relative weakness of glass to tensile forces. By removing most, if not all, of the radially-directed tensile forces from the bonding layer 44, however, the present invention minimizes the risk of failure at this bonding layer.

It has been empirically determined by the inventors herein that the diameter $D_1$ should be greater than the diameter $D_2$ by an amount of at least approximately six times the thickness of the diaphragm to assure optimal reduction of the radially-directed tensile forces on the measured pressure side bonding layer 44. This relationship may be expressed by the equation $$(D_1 - D_2) \geq 6t, \qquad (1)$$

where t is the thickness of the diaphragm. The remaining component of the tensile forces applied to the bonding layers 44 and 46 is axially-directed, and it is a function of axially-directed forces transferred to the bonding layer from the diaphragm as axially-directed pressures are applied to the latter. The overlapping area of the two bonding layers must be sufficient to withstand this axial loading to prevent the separation of the transducer components. In larger-sized transducers, there is usually a sufficient overlapping area even with the difference between $D_1$ and $D_2$ being substantially greater than the minimum amount defined in Equation (1) above. In smaller sensors, however, care must be taken that the difference between $D_1$ and $D_2$ is not so great that the overlapping bonding layer area is insufficient to withstand the axially-directed forces to which it would be subjected. Thus, an upper limit must be placed on the difference between $D_1$ and $D_2$. This upper limit has been determined to be about one-third of the average width of the overlapping area of the two bonding layers. Expressed in another way, if $D_3$ is defined as the average outside diameter of the overlapping area (as shown in FIG. 2), then the average width of the overlapping area may be expressed as $(D_3 - D_1)$. Thus, the relationship for a maximum difference between $D_1$ and $D_2$ may be expressed as follows:

$$(D_1 - D_2) \leq \tfrac{1}{3}(D_3 - D_1) \qquad (2);$$

or, conversely:

$$(D_3 - D_1) \geq 3(D_1 - D_2). \qquad (3)$$

It can be seen that, as indicated by Equation (3) above, the average width of the overlapping area must be at least three times the difference between the respective inside diameters of the measured pressure side bonding area and the reference pressure side bonding area. With this minimum amount of overlapping area, sufficient support against axially-directed tensile forces to prevent component separation will be assured.

With the two bonding layers 44 and 46 configured as described above, the transducer will exhibit enhanced resistance to bonding layer fracture due to tensile loading experienced at the bonding layers, particularly the measured pressure side bonding layer 44. Specifically, the heretofore fracture-vulnerable measured pressure side bonding layer 44 is relieved of most, if not all, of the potentially destructive radially-directed tensile forces, without sacrificing resistance to axially-directed loading. This result is accomplished without complex structural additions or modifications for isolating the bonding layers from the tensile forces. Not only are manufacturing costs thereby saved, but the resulting transducer remains mechanically simple and reliable. In addition, the bonding agent can be selected for optimum thermal characteristics, rather than on the basis of a compromise between thermal characteristics and mechanical strength.

While a preferred embodiment of the invention has been described above, various modifications will suggest themselves to those skilled in the pertinent arts. For example, the wafer used to form the diaphragm may be of silicon, as mentioned above, instead of sapphire, with diffused silicon strain gauges, as is well-known in the art. The cap and base might then be made of silicon as well, with a bonding agent such as silicon dioxide being used to achieve satisfactory thermal matching. The diaphragm itself might assume a number of shapes; circular, for example, instead of square or rectangular, as described above. Finally, it should be noted that the dimensional relationships expressed by Equations (1), (2), and (3) above are approximations only. Thus, the upper and lower limits for the range of $(D_1 - D_2)$ are not absolute limits, merely optimum limits. Satisfactory results may be achieved, in particular applications, for values of $(D_1 - D_2)$ which fall slightly outside of this range. For example, the lower limit for $(D_1 - D_2)$ expressed in Equation (1) may, for some applications, be as low as approximately 5t.

These and other modifications should be considered within the spirit and scope of the invention, as defined by the claims which follow.

What is claimed is:

1. A pressure sensor of the type including a pressure-responsive diaphragm having a substantially uniform thickness and a central active area with strain-sensing elements thereon, said diaphragm being bonded on a first side to a first housing element and on a second side to a second housing element, said first and second housing elements including means for exposing said first and second diaphragm sides to first and second pressures, respectively, wherein the improvement comprises:

a first bonding layer between said first side of said diaphragm and said first housing element and surrounding said active area of said diaphragm; and a second bonding layer between said second side of said diaphragm and said second housing element and surrounding said active area of said diaphragm;

wherein each of said first and second bonding layers has an inside diameter, such that the inside diameter of said first bonding layer is greater than the inside diameter of said second bonding layer by a factor of at least approximately five times the thickness of said diaphragm.

2. The pressure sensor of claim 1, wherein said first bonding layer has an inside diameter that is greater than the inside diameter of said second bonding layer by an amount of at least six times the thickness of said diaphragm.

3. The pressure sensor of claim 1, wherein said first and second bonding layers have an overlapping area with a width that is at least three times greater than the difference between the respective inside diameters of said first and second bonding layers.

4. The pressure sensor of claim 1, wherein said first and second housing elements are formed of a ceramic material, said diaphragm is a monocrystalline wafer, and said first and second bonding layers include a bonding agent, and wherein said housing elements, said diaphragm, and said bonding agent are formed from materials having approximately equal coefficients of thermal expansion.

5. The pressure sensor of claim 4, wherein said diaphragm is a wafer of monocrystalline aluminum oxide and said bonding agent includes a borosilicate glass.

6. The pressure sensor of claim 5, wherein said strain-sensing elements are silicon piezoresistive elements epitaxially grown on said second side of said diaphragm in said active area.

7. The pressure sensor of claim 1, wherein said means for exposing said first and second sides of said diaphragm respectively to first and second pressures comprises:
a first chamber defined between said first side of said diaphragm and the interior of said first housing element;
a second chamber defined between said second side of said diaphragm and the interior of said second housing element; and
passage means through said first housing element and into said first chamber for introducing said first pressure into said first chamber;
wherein said second pressure is a reference pressure contained in said second chamber.

8. A pressure sensor, comprising:
a first housing element having a first central interior recess of diameter $D_1$ wounded by a first peripheral area;
a second housing element having a second central interior recess of diameter $D_2$ wounded by a second peripheral area; and
a pressure-responsive diaphragm of substantially uniform thickness t, and having a central active area, said diaphragm being bonded around said active area between said first and second peripheral areas, so that a first chamber is defined by said first recess and a first side of said diaphragm, and a second chamber is defined by said second recess and a second side of said diaphragm;
wherein said first and second peripheral areas define an overlapping area with an average outside diameter $D_3$; and
wherein $D_1$ is greater than $D_2$ by an amount of at least 6t; and
wherein $D_3$ is greater than $D_1$ by an amount of at least $3(D_1-D_2)$.

9. The pressure sensor of claim 8, wherein said first chamber is adapted to receive a pressure to be measured, and wherein said second chamber is adapted to contain a reference pressure.

10. The pressure sensor of claim 8, wherein said diaphragm is made of monocrystalline aluminum oxide, said first and second housing elements are made of a ceramic material, and said diaphragm is bonded to said first and second peripheral areas by a bonding agent, said ceramic material and said bonding agent having coefficients of thermal expansion approximately equal to that of monocrystalline aluminum oxide.

11. The pressure sensor of claim 10, wherein said bonding agent includes a borosilicate glass.

12. The pressure sensor of claim 10, wherein said diaphragm includes a plurality of silicon piezoresistive elements epitaxially deposited on said second side thereof in said active area.

13. A pressure sensor, comprising:
a first housing element having a first central interior recess;
a second housing element having a second central interior recess;
a pressure-responsive diaphragm of substantially uniform thickness and having a central active area provided with a plurality of strain-sensing elements thereon, said diaphragm being bonded on a first side to said first housing element so as to form a first chamber between said first side and said first recess, said diaphragm being bonded on a second side to said second housing element so as to form a second chamber between said second side and said second recess;
a first bonding layer between said first side of said diaphragm and said first housing element and surrounding said first recess;
a second bonding layer between said second side of said diaphragm and said second housing element and surrounding said second recess;
wherein each of said first and second bonding layers has an inside diameter, such that the inside diameter of said first bonding layer is greater than the inside diameter of said second bonding layer by an amount of at least six times the thickness of said diaphragm.

14. The pressure sensor of claim 13, wherein said first and second bonding layers have an overlapping area with a width that is at least three times greater than the difference between the respective inside diameters of said first and second bonding layers.

15. the pressure sensor of claim 13, wherein said first housing element includes means for admitting a pressure to be measured to said first chamber, and wherein said second chamber is adapted to contain a reference pressure.

16. The pressure sensor of claim 13, wherein said diaphragm, said first and second housing elements, and said first and second bonding layers are formed of of materials having approximately equal coefficients of thermal expansion.

17. The pressure sensor of claim 16, wherein said diaphragm is a sapphire wafer, said first and second housing elements are formed of an aluminum oxide ceramic, and said first and second bonding layers are formed substantially of a borosilicate glass.

18. The pressure sensor of claim 17, wherein said strain-sensing elements are silicon piezoresistive elements epitaxially deposited on said second side of said diaphragm of said active area.

* * * * *

UNITED STATES PATENT OFFICE
CERTIFICATE OF CORRECTION

Patent No. 4,600,912　　　　　　　　　　Dated July 15, 1986

Inventor(s) Eugene A. Marks, et al.

It is certified that error appears in the above-identified patent and that said Letters Patent are hereby corrected as shown below:

| Column | Line | | |
|---|---|---|---|
| 7 | 31 | "wounded" should read | --bounded-- |
| 7 | 34 | "wounded" should read | --bounded-- |

Signed and Sealed this

Seventh Day of October, 1986

[SEAL]

Attest:

DONALD J. QUIGG

Attesting Officer　　　Commissioner of Patents and Trademarks